(12) United States Patent
Omura et al.

(10) Patent No.: US 6,345,004 B1
(45) Date of Patent: Feb. 5, 2002

(54) REPAIR ANALYSIS CIRCUIT FOR REDUNDANCY, REDUNDANT REPAIRING METHOD, AND SEMICONDUCTOR DEVICE

(75) Inventors: Ryuji Omura, Tokyo; Kazushi Sugiura, Hyogo; Tatsunori Komoike, Tokyo, all of (JP)

(73) Assignees: Mitsubishi Denki Kabushiki Kaisha, Tokyo; Ryoden Semiconductor System Engineering Corporation, Hyogo, both of (JP)

( * ) Notice: Subject to any disclaimer, the term of this patent is extended or adjusted under 35 U.S.C. 154(b) by 0 days.

(21) Appl. No.: 09/745,421

(22) Filed: Dec. 26, 2000

(30) Foreign Application Priority Data

Jul. 21, 2000 (JP) ........................................ 2000-220607

(51) Int. Cl.$^7$ .............................................. G11C 7/00
(52) U.S. Cl. .................... 365/200; 365/201; 365/230.03
(58) Field of Search ................................ 365/200, 201, 365/230.03; 714/6

(56) References Cited

U.S. PATENT DOCUMENTS

| | | | | |
|---|---|---|---|---|
| 5,452,258 A | * | 9/1995 | Hotta | 365/200 X |
| 5,577,050 A | | 11/1996 | Bair et al. | |
| 5,983,358 A | * | 11/1999 | Horiguchi et al. | 714/6 |
| 6,243,307 B1 | * | 6/2001 | Kawagoe | 365/201 |

FOREIGN PATENT DOCUMENTS

JP    Hei 8-255500    10/1996

* cited by examiner

*Primary Examiner*—Huan Hoang
(74) *Attorney, Agent, or Firm*—McDermott, Will & Emery

(57) ABSTRACT

A repair analysis circuit for redundancy, a redundant method for repairing a redundant, and a semiconductor device that can shorten time for testing defective memory cells, that eliminate the need of failure memories having a huge capacity for storing defective bits to make the testing apparatus inexpensive, and that easily cope with increase and decrease in IO numbers. A large number of IO outputs MOUT are collectively compared with a specified expected value, and as a result resultant judgment information DOUT is outputted to an error information acquiring device 22, and an analyzing device 23 reads table information sequentially from each block to obtain replacing data, and the replacing data are outputted serially to the external tester through the external I/F circuit 24. The redundant memory cell 4a itself can be made to compare with a specified expected value in the same manner as other memory cells 4 or the like. By outputting the result of determination can also be outputted to the error information acquiring device 22 in the same manner as judgment information DOUT for other memory cells 4 or the like, repair analysis can be performed without using any defective redundant memory cells.

8 Claims, 9 Drawing Sheets

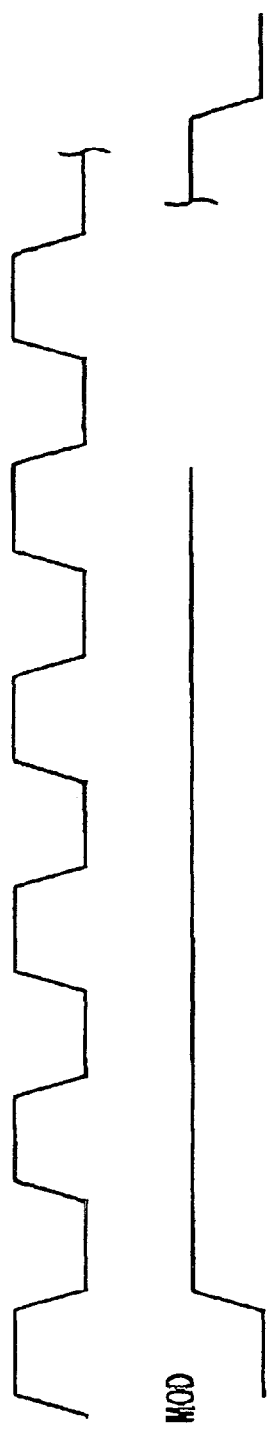
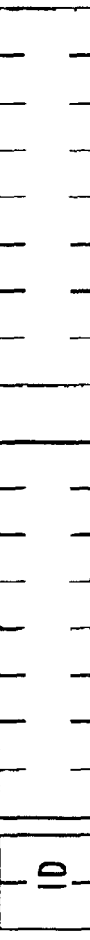
Fig. 4 (A) CLOCK
Fig. 4 (B) MOD
Fig. 4 (C) SI
Fig. 4 (D) SO
Fig. 4 (E)    35   36   37    ID

REPAIR ANALYSIS CIRCUIT FOR REDUNDANCY, REDUNDANT REPAIRING METHOD, AND SEMICONDUCTOR DEVICE

BACKGROUND OF THE INVENTION

1. Field of the Invention

The present invention relates to a repair analysis circuit for redundancy, a redundant repairing method and a semiconductor device, more specifically to a circuit and a method for repairing a defective memory cell in a semiconductor memory device packaged in a semiconductor device and to a semiconductor device that comprises a repair analysis circuit for redundancy.

2. Description of Related Art

Heretofore, a semiconductor memory device packaged in a semiconductor device (hereafter called "memory IC") has contained a redundant memory cell for a repair of a defective memory cell, and by using the redundant memory cell in place of the defective memory cell, the memory IC has been repaired to be a perfect product. The repair has been performed based on memory defect information acquired from a semiconductor testing apparatus (hereafter abbreviated as "ATE") comprising a memory defect storage for storing failed memories in the memory IC, and a redundant repair analyzing apparatus for specifically computing and analyzing the address of the memory to be replaced with the redundant memory cell responding to conditions established by the linkage of the row (Row) side and the column (Col) side of the redundant memory cell. Therefore, there has been a problem that the time for testing the defective memory cell is difficult to shorten because of the limitation of the number of input pins on the ATE that performs repair.

In order that the testing apparatus tests a large number of memory cells at the same time and repairs defective memory cells, a failure memory for storing a huge number of defective bits is required. For example, if a memory cell has 16 megabits and 16 memory cells are measured simultaneously, the number of defective bits that must be stored by the failure memory is 256 megabits (16×16 megabits). Since the testing apparatus uses an expensive SRAM, there has been a problem that the testing apparatus is extremely expensive.

Furthermore, when defective memory cells are to be repaired, it has had to take out the input/output (I/O) signals of the semiconductor memory device packaged on a semiconductor device in several times due to the limitation of the number of pins of the semiconductor itself or of the testing apparatus. For example, since the internal signals of 128 input/output signals (hereafter abbreviated as "128IO" or "128[IO]") are outputted as 8 IO pins by address control, 128 IO have had to be taken out in several times. When the number of IOs increases or decreases, it has been extremely difficult to cope with change in the number of IOs.

SUMMARY OF THE INVENTION

Therefore, the object of the present invention is to solve above-described problems, and to provide a repair analysis circuit for redundancy, a redundant repairing method, and a semiconductor apparatus that can cope with increase and decrease in the number of IOs by shortening the time for testing defective memory cells, making the testing apparatus inexpensive by eliminating the failure memory that has a huge capacity for storing defective bits.

According to a first aspect of the present invention, there is provided a repair analysis circuit for redundancy for repairing defective memory cells in a semiconductor memory device, the semiconductor memory device comprising memory cells arranged in a matrix, and redundant memory cells arranged in the row and/or column direction of the memory cells, the repair analysis circuit for redundancy comprising: an error information acquiring portion provided in each predetermined block of the memory cells, the error information acquiring portion stores judgement information including defective information that contains the address of the defective memory cell in the block and the output from the defective memory cell, and th andidate address of the redundant memory cell that repairs the defective memory cell, and an analyzing portion sequentially inputting the judgement information stored in the error information acquiring portions into each of the error information acquiring portions, and obtaining the redundant memory cell that repairs the defective memory cell for each of the predetermined blocks.

According to a second aspect of the present invention, there is provided a semiconductor device, comprising: a semiconductor memory device having memory cells arranged in a matrix, and redundant memory cells arranged in the row and/or column direction of the memory cells; a judging circuit disposed in each specified block of the memory cells for comparing data outputted from the block with a specified expected value; and outputting judgement information comprising defect information that contains the address of a defective memory cell in the block and the output from the defective memory cell, and the address of the candidate redundant memory cell that repairs the defective memory cell, and a repair analysis circuit for redundancy for repairing the defective memory cell in the semiconductor memory device, the repair analysis circuit for redundancy, having: error information acquiring portions that store judgment information outputted from the judgment circuit; and an analyzing portion that inputs defect information stored in each of the error information acquiring portions and the address of the candidate redundant memory cell sequentially, and obtains a redundant memory cell to repair defective memory cells in each of the specified blocks.

According to a third aspect of the present invention, there is provided a redundant repairing method for repairing defective memory cells in a semiconductor memory device having memory cells arranged in a matrix, and redundant memory cells arranged in the row and/or column direction of the memory cells, comprising the steps of an expected value generating of making a pattern generator generate a specified expected value; a judgment of comparing data outputted from a specified block of the memory cell with the expected value generated in the step of expected value generating, and outputting judgement information having defect information that contains the address of a defective memory cell in the block and the output from the defective memory cell, and the address of a candidate redundant memory cell to repair the defective memory cell; an error information acquiring of storing judgment information outputted in the step of judgment in each of the specified blocks; and an analyzing of sequentially inputting judgment information in each of the specified blocks stored in the step of error information acquiring, and determining the redundant memory cell to repair the defective memory cell in each of the specified blocks.

According to a fourth aspect of the present invention, there is provided a repair analysis circuit for redundancy for repairing defective memory cells in a semiconductor memory device, comprising: error information acquiring devices separately disposed for storing failure information in each address; and an analyzing device for collectively analyzing the error information acquiring devices, wherein the error information acquiring devices are disposed separately in 32 [IO] units underneath a data outputting portion that outputs the data from the semiconductor memory device, and the analyzing device is disposed underneath a Row decoder present in a central portion of the semiconductor memory device.

The above and other objects, effects, features and advantages of the present invention will become more apparent from the following description of the embodiments thereof taken in conjunction. with the accompanying drawings.

BRIEF DESCRIPTION OF THE DRAWINGS

FIGS. 4(A)–4(E) shows a timing chart of signals between the redundant repair analyzing circuit 10 and the logic tester 30 in first embodiment of the present invention.

DETAILED DESCRIPTION OF THE PREFERRED EMBODIMENTS

Figure 1:
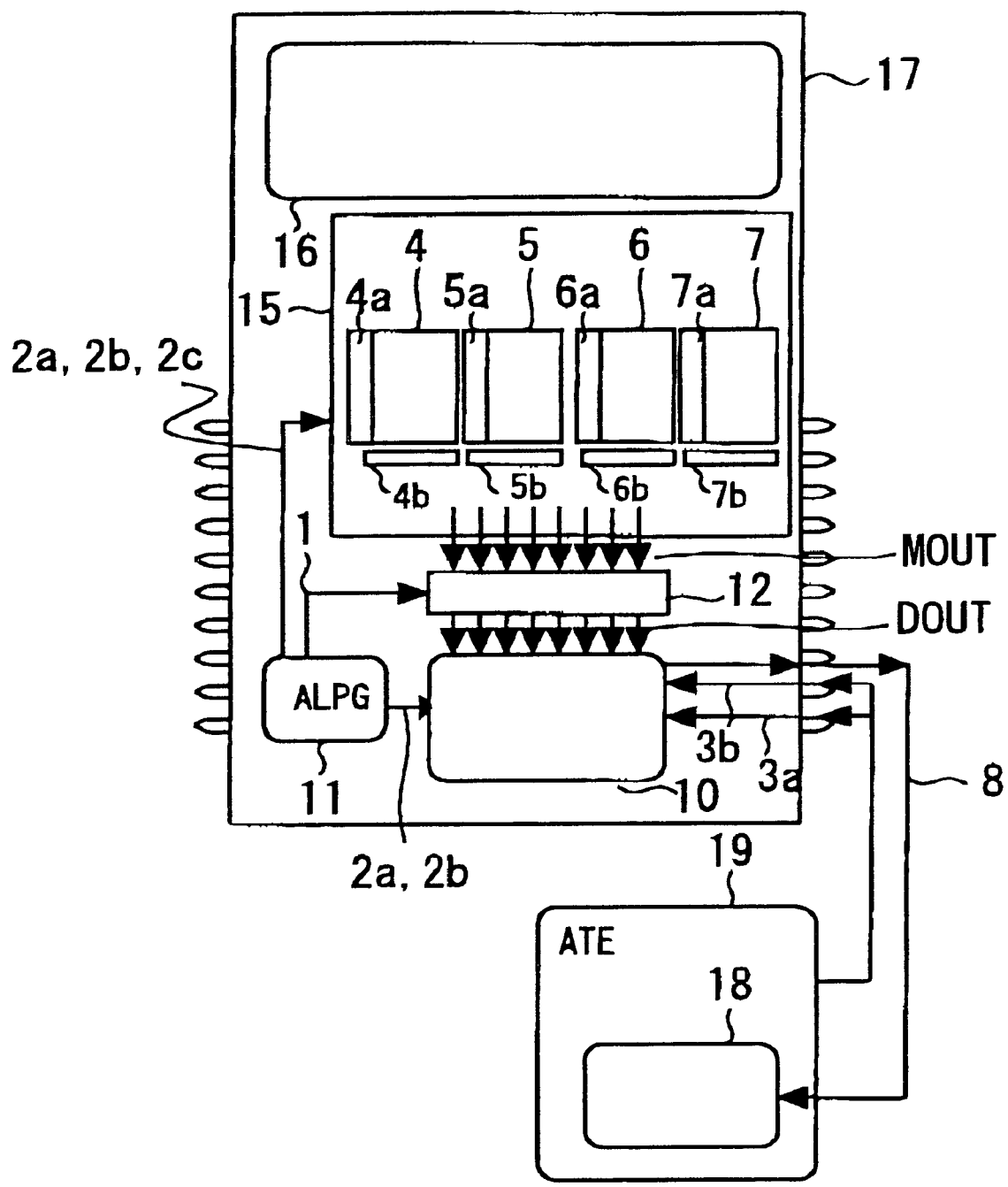
FIG. 1 shows a semiconductor device containing a redundant repair analyzing circuit (repair analysis circuit for redundancy) in first embodiment of the present invention and a semiconductor memory device, connected to a tester (ATE).

Embodiments of the present invention will be described below with reference to the accompanying drawings. It is noted that the same reference symbols in the drawings denote the same or corresponding components.

The embodiments of the present invention will be described in detail below referring to the drawings.
First Embodiment
FIG. 1 shows a semiconductor device containing a redundant repair analyzing circuit (repair analysis circuit for redundancy) in first embodiment of the present invention and a semiconductor memory device, connected to a tester (ATE). In FIG. 1, reference numerals 4, 5, 6, and 7 denote memory cells, 4a, 5a, 6a, and 7a denote row (Row) side redundant memory cells of memory cells 4, 5, 6, and 7, respectively, 4b, 5b, 6b, and 7b denote column (Col) side redundant memory cells of memory cells 4, 5, 6, and 7, respectively, 15 denotes a semiconductor memory device that contains memory cells 4 through 7, row-side redundant memory cells 4a through 7a, and column-side redundant memory cells 4b through 7b, 11 denotes a pattern generator (algorithmic pattern generator: ALPG) that generates patterns for testing the semiconductor memory device 15, 12 denotes a judging circuit for judging the defective memory cell in the semiconductor memory device by comparing output from the semiconductor memory device 15 with the pattern (expected value) from APLG 11, 10 denotes a redundant repair analyzing circuit for determining the redundant memory cell to replace the defective memory cell based on the result obtained from the judging circuit 12, 16 denotes a logic circuit, 17 is a semiconductor device that contains the logic circuit 16, the semiconductor memory device 15, the judging circuit 12, ALPG 11, and the redundant repair analyzing circuit 10, 19 denotes an ATE present outside the semiconductor device 17 and connected to the redundant repair analyzing circuit 10, and 18 denotes a serial data acquiring device that is present in the ATE 19, and inputs serial data from the redundant repair analyzing circuit 10. Although only four memory cells 4 through 7 are shown, these are examples for description, and in actual devices, more than four memory cells can be contained.

As FIG. 1 shows, from the ALPG 11, address signals 2a, control signals 2b, and write data 2c are sent to the semiconductor memory device 15, and address signals 2a and control signals 2b are sent to the redundant repair analyzing circuit 10. Furthermore, from the ALPG 11, expected value data 1 is sent to the judging circuit 12. The expected value data 1 and the output MOUT from the semiconductor memory device 15 are inputted to the judging circuit 12, and the result of judgment DOUT Judgment information) is outputted to the redundant repair analyzing circuit 10. Control data 3a and 3b are sent from the ATE 19 to the redundant repair analyzing circuit 10, and serial data 8 are sent from the redundant repair analyzing circuit 10 to the ATE 19. The semiconductor memory device 15 comprises several, e.g. two row-side redundant memory cells 4a and the like and several, e.g. one column-side redundant memory cell 4b and the like in each block determined by the desired design. By replacing these redundant memory cells 4a, 4b, and the like with defective memory cells of the memory cell 4, the defective memory cells can be repaired. A defective memory cell is replaced by a redundant memory cell 4a or the like by cutting the fuse of the address decoder (not shown) using a laser trimmer (not shown). As a result, when the address value 2a of the defective memory cell is inputted, this address 2a is changed to the address of the replaced redundant memory cell 4a or the like, and this redundant cell can be accessed, whereby the semiconductor memory device that has defective memory cells can be used as a perfect semiconductor memory device.

Figure 2:
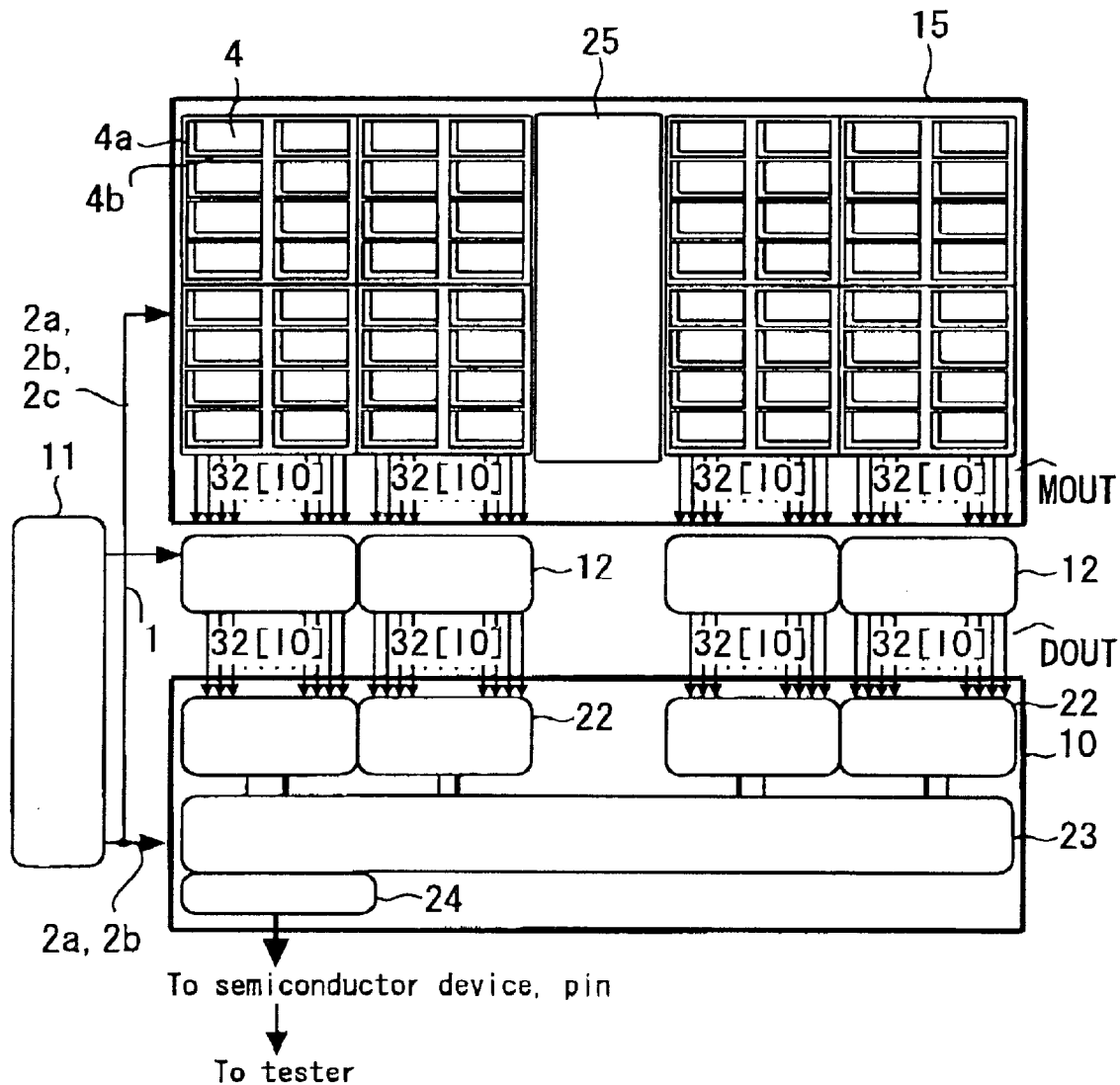
FIG. 2 shows the details of the redundant repair analyzing circuit and the semiconductor memory device according to first embodiment of the present invention.

FIG. 2 shows the details of the redundant repair analyzing circuit and the semiconductor memory device according to first embodiment of the present invention. In FIG. 2, since the parts denoted by the same reference numerals as in FIG. 1 are the same parts, the description of these parts will be omitted. In FIG. 2, the reference numeral 25 denotes a Row decoder that decodes the row (Row) address of the memory cell 4 and the like. As FIG. 2 shows, a desired number of the memory cells 4 and the like in the semiconductor memory device 15 may be gathered, for example for every output MOUT for 32 inputs/outputs (hereafter abbreviated as "32 [IO]"), into one block. A plurality of the expected value judgment circuits judgment circuits) 12 are also provided in each block, and each expected value judgment circuit 12 outputs the result of judgment DOUT for 32 [IO]. The redundant repair analyzing circuit 10 is composed of an error information-acquiring device 22, an analyzing device 23, and an external interface (I/F) circuit 24. The error information-acquiring device 22 is provided in each plurality of expected value judgment circuits 12, and judgment information about which 10 is defective in which address in the memory cells 4 and the like can be obtained based on the address signals 2a and control signals 2b inputted from the result of judgment DOUT and the pattern generator 11 such as ALPG or the like. The error information-acquiring device 22 can store the address of replacing candidate required for redundant repair analyzing such as memory cells 4a and the information of defect IO. The address of these replacing candidates and defect information can be stored in a specified table (hereafter called "table information"), and this table information can be updated from time to time. The table information in each block can be stored in the error information-acquiring device 22.

Next, the analyzing device 23 reads the table information stored in every error information-acquiring device 22, i.e. every block, and the linkage of the redundant constitution such as memory cells 4a to be the replacing candidate, based on a specified analyzing algorithm (described later) can be checked, and replacing data or replacing information indicating the redundant memory cell to be replaced can be obtained and stored.

The external I/F circuit 24 outputs serially the replacing data stored in the above-described analyzing device 23 to the external tester (not shown) through the pins of the semiconductor device 17. This serial output is outputted based on the control signals and clock signals from the tester.

Although four blocks of the outputs MOUT of 32 [IO] are shown in the above-described semiconductor memory device 15, these are shown as examples for description. In actual device, larger numbers of IOs, such as 256 IOs or 2048 IOs can be outputted at the same time.

According to first embodiment, as described above, these large numbers of IO outputs MOUT can collectively compared with a specified expected value, and resultant judgment information DOUT can be outputted to the error information-acquiring device 22. Thereafter, the table information stored in the error information-acquiring device 22 is read by the analyzing device 23 in the order of blocks, the replacing data to be repaired is obtained by a specified algorithm (described later), and the replacing data can be outputted serially to an external tester through the external I/F circuit 24.

In this case, the redundant memory cell 4a or the like itself can be compared with a specified expected value in the same way as memory cells 4 or the like. By outputting the judgment result to the error information-acquiring device 22 in the same way as the judgment information DOUT for other memory cells 4 or the like, repair analyzing without using the defective redundant memory cell (defective memory cell in redundant memory cells). Therefore, the semiconductor memory device packaged in the semiconductor device 17 can be tested collectively, and repair analyzing can be performed. Thus, the time for testing can be shortened, and the test apparatus can be made inexpensive because no failure memory of a huge capacity for storing defective bits is required.

Figure 3:
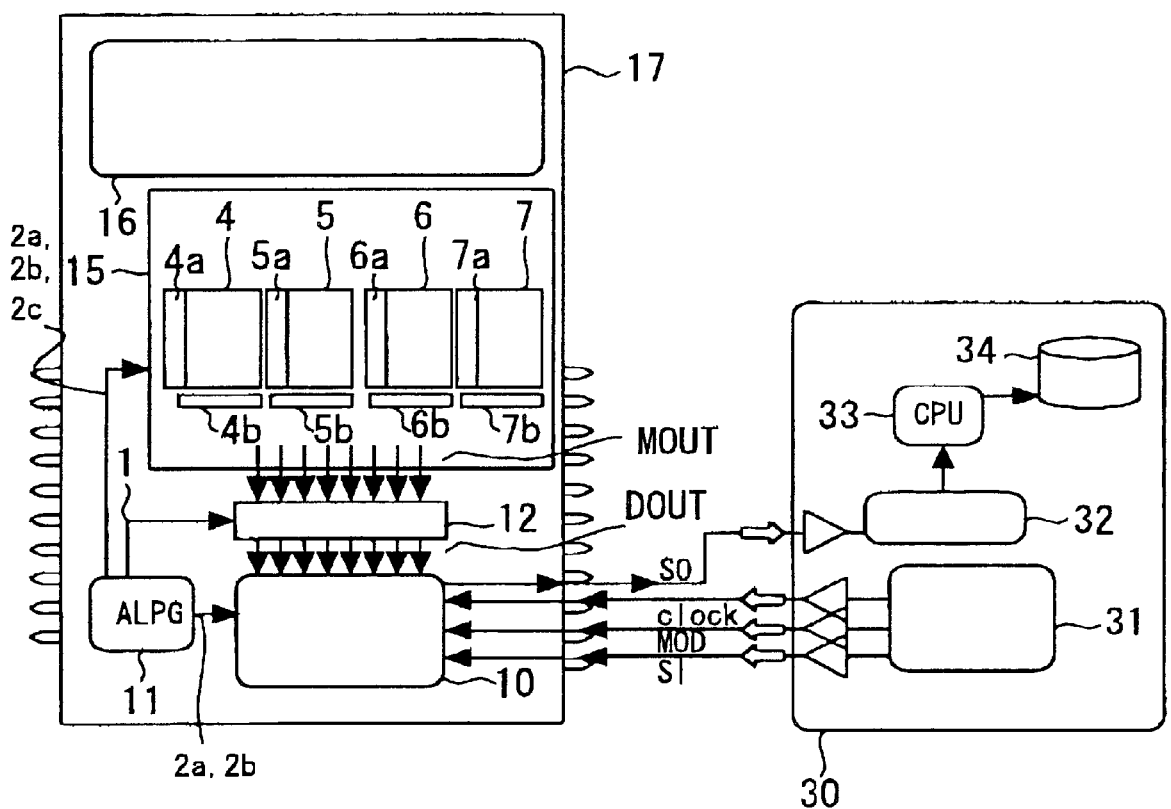
FIG. 3 shows the state of testing the semiconductor memory device in first embodiment of the present invention using a tester.

FIG. 3 shows the state of testing the semiconductor memory device in first embodiment of the present invention using a tester. In FIG. 3, since the parts denoted by the same reference numerals as in FIG. 1 are the same parts, the description of these parts will be omitted. In FIG. 3, the reference numeral 30 denotes a logic tester connected to the redundant repair analyzing circuit 10, which comprises a logic pattern generator (LPG) 31, a judgment portion 32, a CPU 33, and a replacing information file 64 described later. The logic tester 30 and the redundant repair analyzing circuit 10 are connected by four signal lines SO, SI, Clock, and MOD described later. From LPG 31, clock signals, Clock, the signals indicating the command for the output of replacing information, SI, and input-enable signals (or mode signals) for enabling the input of the command, MOD are outputted to the redundant repair analyzing circuit 10. By these MOD signals, various modes can be selected, such as enabling the error information-acquiring device 22 to acquire judgment information (acquiring mode), the analyzing device to perform analyzing (analyzing mode), and the logic tester 30 to read replacing information (read mode). The serial output signal SO that indicates replacing information from the redundant repair analyzing circuit 10 are outputted to the judgment porting 32. This SO contains information about defective bits and the like as described later, and the result of judgment by the judgment porting 32 can be outputted to the replacing information file 34 under the control of the CPU 33.

FIG. 4 shows a timing chart of signals between the redundant repair analyzing circuit 10 and the logic tester 30 in first embodiment of the present invention. FIG. 4(A) shows the clock signal, Clock; FIG. 4(B) shows the command input enable signal, MOD; FIG. 4(C) shows the signal indicating the command for the output of replacing information, SI; FIG. 4(D) shows the serial output signal SO; and FIG. 4(E) shows the data form of replacing information.

As FIGS. 4(A) to 4(D) show, first, the test mode is started when the command input enable signal, MOD becomes high (HI). The mode is selected by the signal SI in next three clocks. For example, when the read mode is selected, the read of replacing information is started, and the serial output signal, SO indicating replacing information (a specified number of bit columns) is outputted synchronizing the rising edge of the clock signal, Clock. The selected mode ends at the rising edge of the clock signal, Clock when the mode signal, MOD becomes low (LO).

FIG. 4(E) shows the form of the serial output signal, SO indicating replacing information. The signal SO is composed of an ID value 35 that indicates the identification of the signal, a code identification serial number 36 that indicates information for judging the memory region, and replacing information (fuse information) that indicates the address of the redundant memory cell to be replaced. The ID value 35 is composed of 2 bits: the ID value 35='00' indicates that there are no defective bits; the ID value 35='01' indicates that the semiconductor memory device can be repaired, that is, the semiconductor memory device is good; the ID value 35='10' indicates that the semiconductor memory device cannot be repaired, that is, the semiconductor memory device is defective; and the ID value 35='11' indicates that self judgment is abnormal. By determining the ID value 35 by the logic tester 30 using the normal logic function, whether the semiconductor memory device 15 can be repaired or not can be determined easily. The result of determination is sequentially acquired under the control of the CPU 33, and can be stored in the replacing information file 34. The data stored in the replacing information file 34 are externally transmitted, and can be used for replacing using a laser trimming apparatus or the like.

Figure 5:
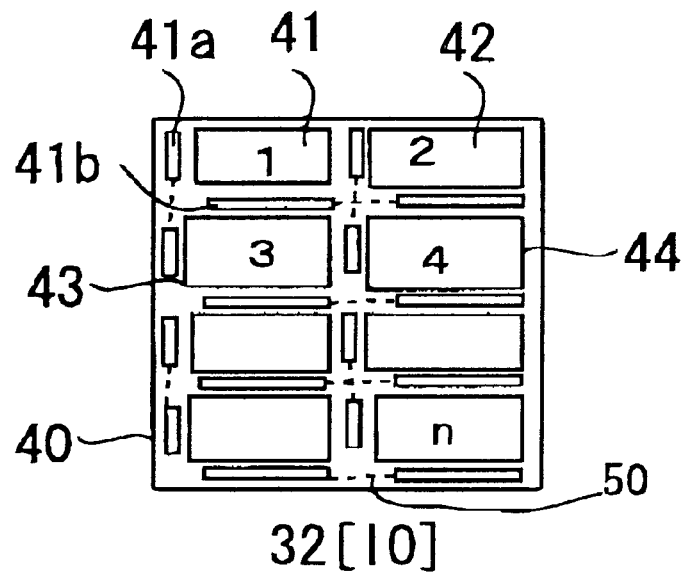
FIGS. 5(A)–(C) shows examples of analyses for various redundant constitutions in first embodiment of the present invention.
Figure 5:
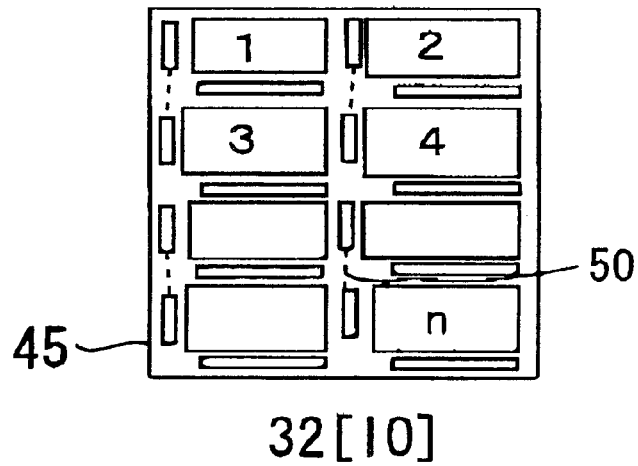
Figure 5:
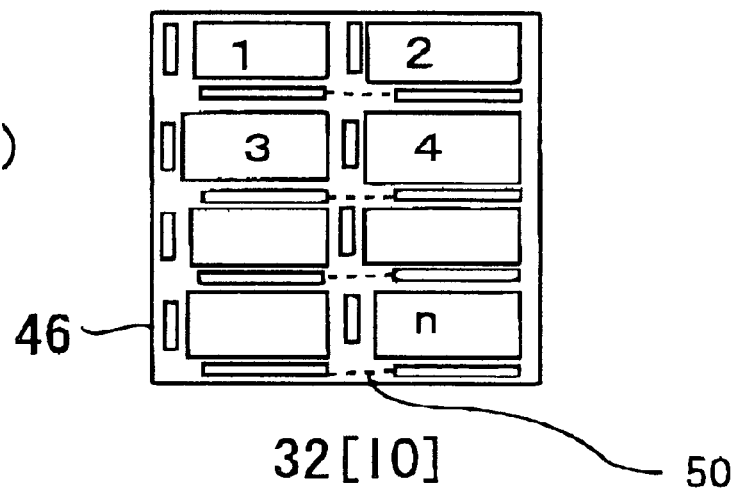

FIG. 5 shows examples of analyses for various redundant constitutions in first embodiment of the present invention. FIG. 5(A) shows the block 40 of the memory cell, FIG. 5(B)

shows the block 45 of the memory cell, and FIG. 5(C) shows the block 46 of the memory cell. In FIGS. 5(A) to 5(C), reference numerals 41, 42, 43, and 44 show memory cells, 41a shows the column-side redundant memory cell of the memory cell 41, and 41b shows the row-side redundant memory cell of the memory cell 41. For other memory cells 42 and the like, reference numerals of row-side redundant memory cells and column-side redundant memory cell of the memory cells are omitted, but other memory cells 42 and the like are same as the memory cell 41. Although redundant memory cells 41a and the like of the semiconductor memory device 17 are present independently for each subject region, the replacing circuit can be constituted depending on various synchronizing conditions (logical synchronizing condition 50) in row and column sides. As described below, the process performed by the analyzing device 23 differs depending on the synchronizing conditions of the redundant memory cells 41a and the like.

As the block 40 in FIG. 5(A) shows, the content of the memory cell 41, shown as Result 1, is read, and then the content of the memory cell 42, shown as Result 2, is read. Since the memory cell 41 is synchronized with the memory cell 42, the row-side address to be replaced is determined from the contents of Result 1 and Result 2. Next, the content of the memory cell 43, shown as Result 3, is read. Since the memory cell 41 is synchronized with the memory cell 43, the column-side address to be replaced is determined from the contents of Result 1 and Result 3. Then, the content of the memory cell 44, shown as Result 4, is read. Since the memory cell 42 is synchronized with the memory cell 44, the column-side address to be replaced is determined from the contents of Result 2 and Result 4.

As the block 45 in FIG. 5(B) shows, the content of the memory cell 41, shown as Result 1, is read, and the row-side address to be replaced is determined from the contents of Result 1. Next, the content of the memory cell 42, shown as Result 2, is read, and the column-side address to be replaced is determined from the contents of Result 2. Next, the content of the memory cell 43, shown as Result 3, is read. Since the memory cell 41 is synchronized with the memory cell 43, the column-side address to be replaced is determined from the contents of Result 1 and Result 3. Then, the content of the memory cell 44, shown as Result 4, is read. Since the memory cell 42 is synchronized with the memory cell 44, the column-side address to be replaced is determined from the contents of Result 2 and Result 4.

As the block 46 in FIG. 5(C) shows, the content of the memory cell 41, shown as Result 1, is read, and then the content of the memory cell 42, shown as Result 2, is read. Since the memory cell 41 is synchronized with the memory cell 42, the row-side address to be replaced is determined from the contents of Result 1 and Result 2. Next, the content of the memory cell 43, shown as Result 3, is read, and the column-side address to be replaced is determined from the content of Result 3. Then, the content of the memory cell 44, shown as Result 4, is read, and the column-side address to be replaced is determined from the content of Result 4.

As described above, by changing the process for determining the continuity of the row side and the column side, the redundant repair analyzing circuit 10 that can easily correspond to various continuous constitutions can be provided.

Figure 6:
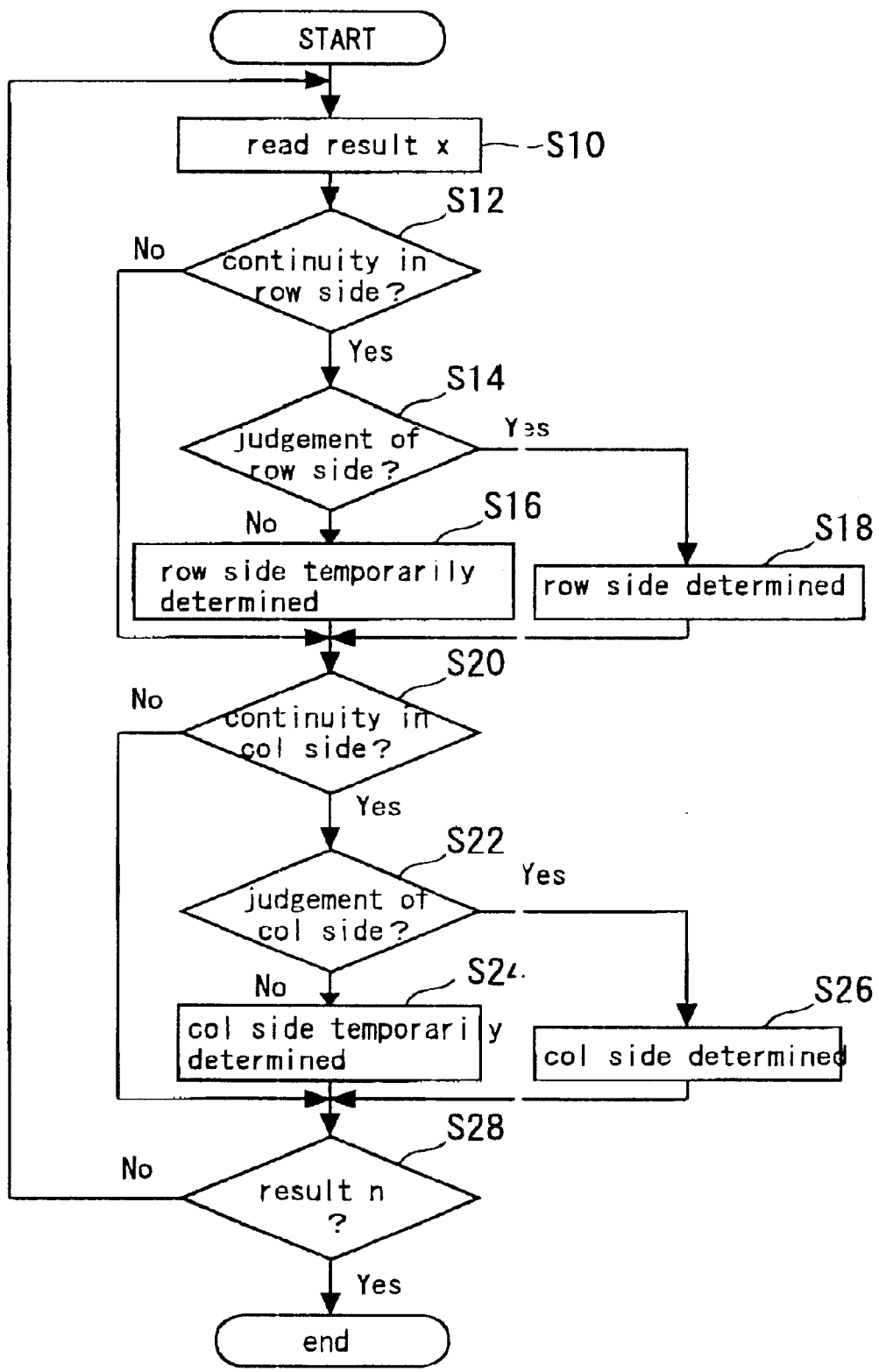
FIG. 6 shows a flowchart of the analyses of various redundant constitutions in first embodiment of the present invention.

FIG. 6 shows a flowchart of the analyses of various redundant constitutions in first embodiment of the present invention. As FIG. 6 shows, first, Result x is read (Step S 10). The presence of continuity in the row side is determined (Step S 12). When the row side is continuous, whether the judgment of the row side is performed or not is determined (Step S 14). When the judgment is performed, the row side is determined (Step S 18), and when the judgment is not performed, the row side is temporarily determined (Step S 16). When the row side is not continuous in Step S 12, the process goes to Step S 20. Next, the presence of continuity in the column side is determined (Step S 20). When the column side is continuous, whether the judgment of the column side is performed or not is determined (Step S 22). When the judgment is performed, the column side is determined (Step S 26), and when the judgment is not performed, the column side is temporarily determined (Step S 24). When the row column is not continuous in Step S 20, the process goes to Step S 28. Whether the process has been completed to Result n (final) or not is judged (Step S 28), and if the process has not been completed, the process returns to Step S 10, and the above steps are repeated.

According to first embodiment, as described above, a large number of IO outputs MOUT can be compared with a specified expected value collectively, and the judgment information DOUT of the results can be outputted to the error information acquiring device 22. Thereafter, the table information stored in the error information-acquiring device 22 is read by the analyzing device 23 in the order of blocks, the replacing data to be repaired is obtained by a specified algorithm (described later), and the replacing data can be outputted serially to an external tester through the external I/F circuit 24. The redundant memory cell 4a or the like itself can be compared with a specified expected value in the same way as memory cells 4 or the like. By outputting the judgment result to the error information-acquiring device 22 in the same way as the judgment information DOUT for other memory cells 4 or the like, repair analyzing without using the defective redundant memory cell (defective memory cell in redundant memory cells) can be performed. Therefore, the semiconductor memory device 15 packaged in the semiconductor device 17 can be tested collectively, and repair analyzing can be performed. Thus, the time for testing can be shortened, and the test apparatus can be made inexpensive because no failure memory of a huge capacity for storing defective bits is required.

Second Embodiment

Figure 7:
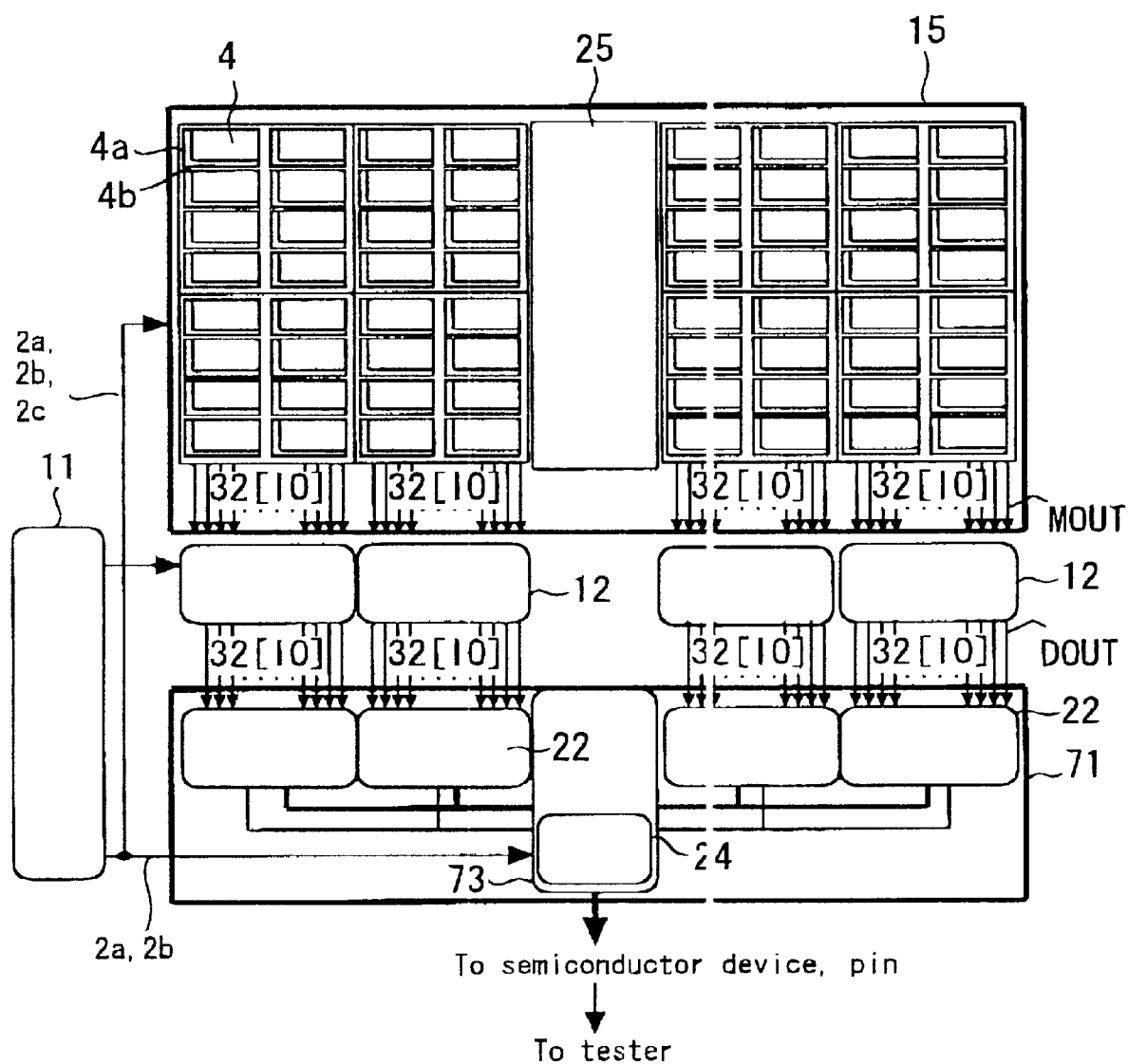
FIG. 7 shows the details of a redundant repair analyzing circuit and a semiconductor device according to second embodiment of the present invention.

FIG. 7 shows the details of a redundant repair analyzing circuit and a semiconductor device according to second embodiment of the present invention. In FIG. 7, since the parts denoted by the same reference numerals as in FIG. 2 are the same parts, the description of these parts will be omitted. In FIG. 7, the reference numeral 73 denotes an analyzing device according to second embodiment, and 71 denotes a redundant repair analyzing circuit that contains the analyzing device 73 according to second embodiment.

As FIG. 7 shows, the analyzing device 73 can be placed immediately underneath the row decoder 25. Since the position of the output MOUT can be physically different from the position of the row decoder 25, the length of the redundant repair analyzing circuit 71 in the vertical direction in FIG. 7 can be shortened, and the redundant repair analyzing circuit 71 can be disposed on the semiconductor device 17 in good space efficiency. Furthermore, when the redundant repair analyzing circuit 71 is expanded by the step of 32 [IO] units, error information acquiring devices 22 of the same height can be increased on the both sides of the analyzing device 73. By disposing the analyzing device 73 on the central portion of the redundant repair analyzing circuit 71, the redundant repair analyzing circuit 71 can be expanded, for example, by increasing IO numbers, without substantially changing the layout.

According to second embodiment, as described above, by disposing the analyzing device 73 on the central portion of the redundant repair analyzing circuit 71, the space efficiency can be improved, and the redundant repair analyzing circuit 71 can be expanded, for example, by increasing IO numbers, without substantially changing the layout.

Third Embodiment

Figure 8:
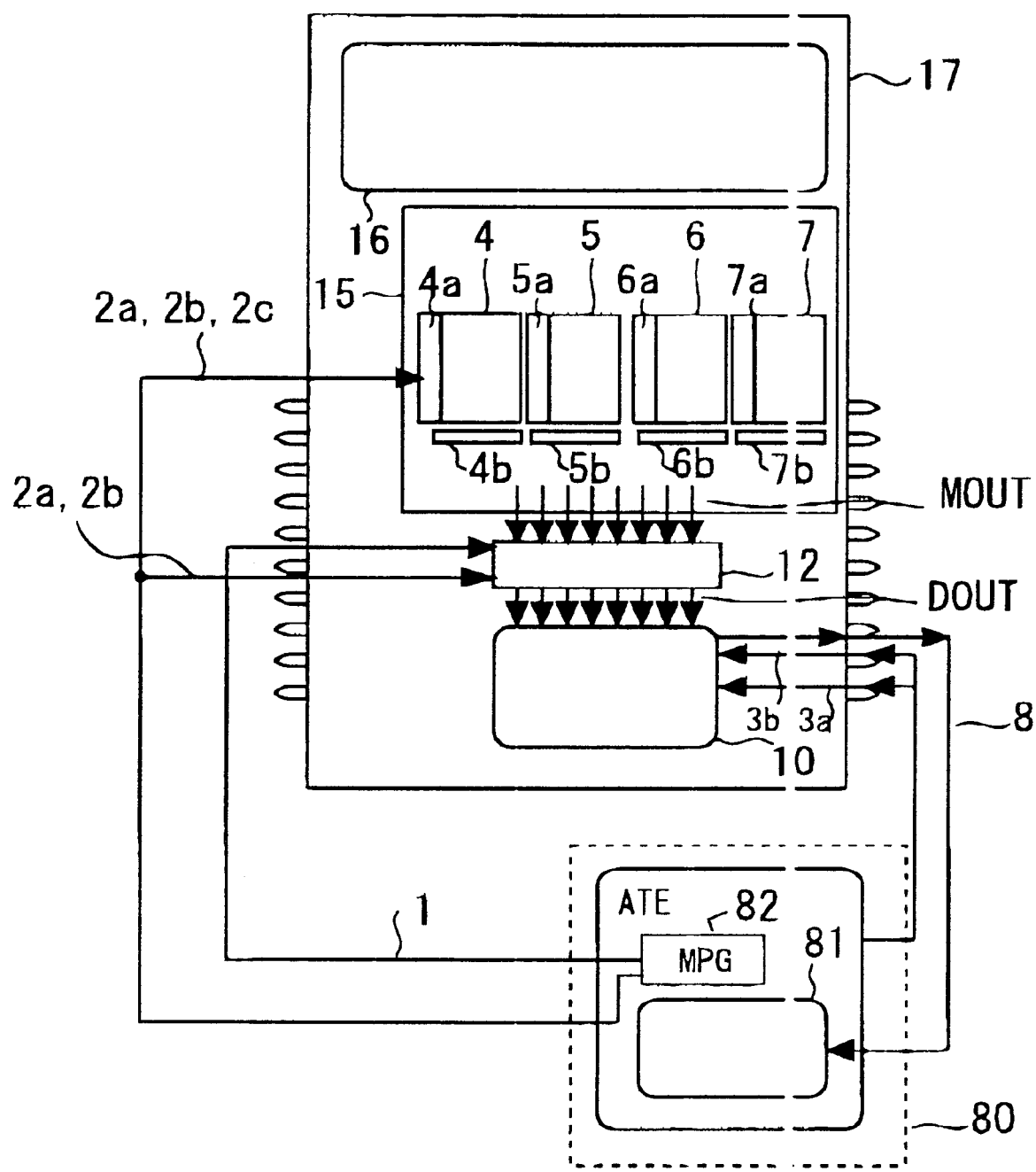
FIG. 8 shows the state of testing a semiconductor memory device in third embodiment of the present invention using a tester.
Figure 9:
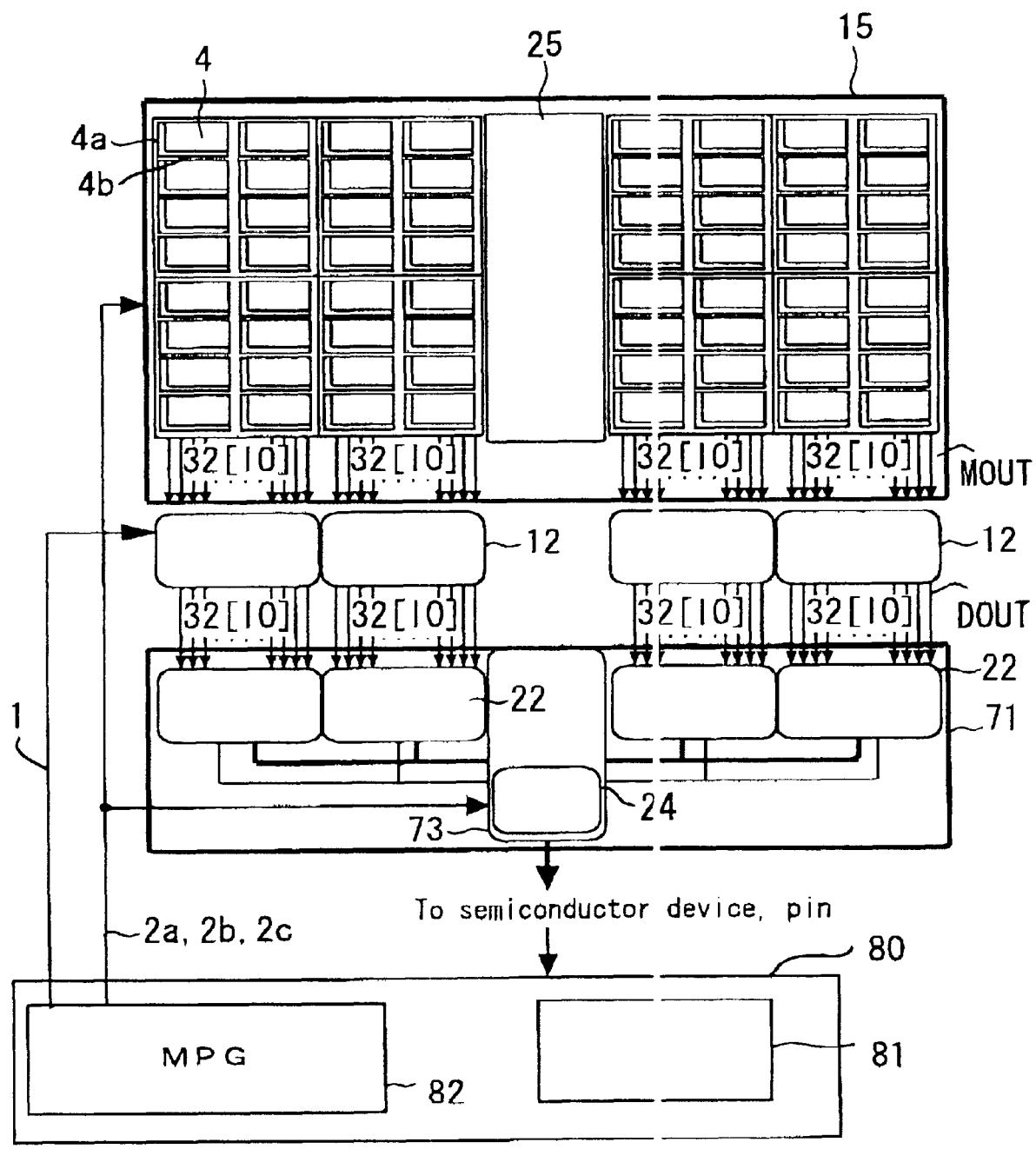
FIG. 9 shows the detail of the redundant repair analyzing circuit and the semiconductor memory device in third embodiment of the present invention

FIG. 8 shows the state of testing a semiconductor memory device in third embodiment of the present invention using a tester. In FIG. 8, since the parts denoted by the same reference numerals as in FIG. 3 are the same parts, the description of these parts will be omitted. In FIG. 8, the reference numeral 81 denotes a defective bit storing memory for storing defective bits, 82 denotes a memory pattern generator (MPG) for generating memory patterns, and 80 denotes an ATE that comprises the defective bit storing memory 81. FIG. 9 shows the detail of the redundant repair analyzing circuit and the semiconductor memory device in third embodiment of the present invention. In FIG. 9, since the parts denoted by the same reference numerals as in FIGS. 2 and 8 are the same parts, the description of these parts will be omitted.

As FIGS. 8 and 9 show, in third embodiment, the ALPG 11 in Embodiments 1 and 2 is taken out from the semiconductor device 17. In place of the ALPG 11 in Embodiments 1 and 2, the ATE 80 sends the expected value data 1 to the judgment circuit 12, and address signals 2a, control signals 2b, and write data 2c to the semiconductor memory device 15. The ATE 80 also sends address signals 2a and control signals 2b to the judgment circuit 12. Such a constitution also enables expansion such as increase in IO numbers without substantially changing the layout as in the Embodiments 1 and 2, and the effect of shortening time required for the test can be obtained. Furthermore, since replacing data can be obtained from the redundant repair analyzing circuit 10, no defective bit storing memory 81 of a huge capacity is required, making the testing apparatus ATE 80 inexpensive.

According to third embodiment, as described above, the ALPG 11 in Embodiments 1 and 2 can be taken out from the semiconductor device 17, and the ATE 80 can be used in place of the ALPG 11. Therefore, expansion such as increase in IO numbers can be performed without substantially changing the layout as in the Embodiments 1 and 2, and time required for the test can be shortened. Furthermore, since no defective bit storing memory 81 of a huge capacity is required, the testing apparatus ATE 80 can be made inexpensive.

As described above, according to the repair analysis circuit for redundancy, the method, and the semiconductor device, a large number of IO outputs MOUT are collectively compared with a specified expected value, resultant judgment information DOUT is outputted to the error information acquiring device 22, the analyzing device 23 reads the table information sequentially from each block to obtain replacing data, and the replacing data are outputted serially to the external tester through the external I/F circuit 24. Therefore, the time required for testing defective memory cells can be shortened, the need of the failure memory of a huge capacity for storing defective bits is eliminated to make the testing apparatus inexpensive, and increase or decrease in IO numbers can be easily accommodated.

Here, the repair analysis circuit for redundancy, the judgement information stored in the error information acquiring portion may further comprise the address of the defective memory cell in the redundant memory cells and the output from the defective memory cell, and the analyzing portion sequentially inputs the judgement information into each of the error information acquiring portions, and obtains redundant memory cells that repair the defective memory cell for each of the predetermined blocks, other than the defective memory cells in the redundant memory cells.

In the repair analysis circuit for redundancy, the analyzing portion may be disposed underneath the row address decoder in the semiconductor memory device, but not underneath the memory cells and the redundant cells.

Here, the repair analysis circuit for redundancy, the analyzing portion may comprise pins for inputting at least clock signals, command input permitting signals, command signals and pins for serially outputting repair information signals related to the redundant memory cell to be repaired to the outside.

Here, the semiconductor device may further comprise a pattern generator that generates a specified expected value, and outputs the expected value to the judgment circuit.

Here, the redundant repairing method, the judgment information outputted in the step of judgment may further contain the address of a defective memory cell in the redundant memory cell, and the output from the defective memory cell, and the step of analyzing inputs the judgmet information in each of the blocks sequentially, and determines a redundant memory cell that repairs defective memory cells in each of the blocks from the redundant memory cells other than defective memory cells.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 2000-220607 filed on Jul. 21, 2000 including specification, claims, drawings and summary are incorporated herein by reference in its entirety.

What is claimed is:

1. A repair analysis circuit for redundancy for repairing defective memory cells in a semiconductor memory device, said semiconductor memory device comprising memory cells arranged in a matrix, and redundant memory cells arranged in the row and/or column direction of said memory cells, said repair analysis circuit for redundancy comprising:

an error information acquiring portion provided in each predetermined block of said memory cells, said error information acquiring portion stores judgement information including defective information that contains the address of the defective memory cell in said block and the output from said defective memory cell, and the candidate address of the redundant memory cell that repairs said defective memory cell, and an analyzing portion sequentially inputting the judgement information stored in said error information acquiring portions into each of said error information acquiring portions, and obtaining the redundant memory cell that repairs the defective memory cell for each of said predetermined blocks.

2. The repair analysis circuit for redundancy according to claim 1, wherein the judgement information stored in said error information acquiring portion further comprises the address of the defective memory cell in said redundant memory cells and the output from said defective memory cell, and said analyzing portion sequentially inputs the judgement information into each of said error information acquiring portions, and obtains redundant memory cells that repair the defective memory cell for each of said predetermined blocks, other than the defective memory cells in said redundant memory cells.

3. The repair analysis circuit for redundancy according to claim 1, wherein said analyzing portion is disposed underneath the row address decoder in said semiconductor memory device, but not underneath said memory cells and said redundant cells.

4. The repair analysis circuit for redundancy according to claim 1, wherein said analyzing portion comprises pins for inputting at least clock signals, command input permitting signals, command signals and pins for serially outputting repair information signals related to the redundant memory cell to be repaired to the outside.

5. A semiconductor device, comprising:
   a semiconductor memory device having memory cells arranged in a matrix, and redundant memory cells arranged in the row and/or column direction of said memory cells;
   a judging circuit disposed in each specified block of said memory cells for comparing data outputted from said block with a specified expected value; and outputting judgement information comprising defect information that contains the address of a defective memory cell in said block and the output from said defective memory cell, and the address of the candidate redundant memory cell that repairs said defective memory cell, and
   a repair analysis circuit for redundancy for repairing said defective memory cell in said semiconductor memory device, said repair analysis circuit for redundancy, having:
      error information acquiring portions that store judgment information outputted from said judgment circuit; and
      an analyzing portion that inputs defect information stored in each of said error information acquiring portions and the address of the candidate redundant memory cell sequentially, and obtains a redundant memory cell to repair defective memory cells in each of said specified blocks.

6. The semiconductor device according to claim 5, further comprising a pattern generator that generates a specified expected value, and outputs said expected value to said judgment circuit.

7. A redundant repairing method for repairing defective memory cells in a semiconductor memory device having memory cells arranged in a matrix, and redundant memory cells arranged in the row and/or column direction of said memory cells, comprising the steps of:
   an expected value generating of making a pattern generator generate a specified expected value;
   a judgment of comparing data outputted from a specified block of said memory cell with the expected value generated in said step of expected value generating, and outputting judgement information having defect information that contains the address of a defective memory cell in said block and the output from said defective memory cell, and the address of a candidate redundant memory cell to repair said defective memory cell;
   an error information acquiring of storing judgment information outputted in said step of judgment in each of said specified blocks; and
   an analyzing of sequentially inputting judgment information in each of said specified blocks stored in said step of error information acquiring, and determining the redundant memory cell to repair the defective memory cell in each of said specified blocks.

8. The redundant repairing method according to claim 7, wherein said judgment information outputted in said step of judgment further contains the address of a defective memory cell in said redundant memory cell, and the output from said defective memory cell, and
   said step of analyzing inputs said judgment information in each of said blocks sequentially, and determines a redundant memory cell that repairs defective memory cells in each of said blocks from said redundant memory cells other than defective memory cells.

* * * * *